United States Patent
Park et al.

(10) Patent No.: US 6,642,610 B2
(45) Date of Patent: Nov. 4, 2003

(54) WIRE BONDING METHOD AND SEMICONDUCTOR PACKAGE MANUFACTURED USING THE SAME

(75) Inventors: Young Kuk Park, Seoul (KR); Byung Joon Han, Singapore (SG); Jae Dong Kim, Tempe, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/745,265

(22) Filed: Dec. 20, 2000

(65) Prior Publication Data

US 2002/0064905 A1 May 30, 2002

(Under 37 CFR 1.47)

(30) Foreign Application Priority Data

Dec. 20, 1999 (KR) .......................................... 1999-59329

(51) Int. Cl.⁷ ........................... H01L 23/02; H01L 23/48
(52) U.S. Cl. ...................... 257/678; 257/686; 257/777; 257/784
(58) Field of Search ................................. 438/106, 109, 438/110, 111, 118; 257/666, 676, 678, 685, 686, 777, 782, 783, 784, 786

(56) References Cited

U.S. PATENT DOCUMENTS

| | | | |
|---|---|---|---|
| 3,851,221 A | 11/1974 | Beaulieu et al. | 317/100 |
| 4,567,643 A | 2/1986 | Droguet et al. | 29/575 |
| 4,730,232 A | 3/1988 | Lindberg | 361/381 |
| 4,763,188 A | 8/1988 | Johnson | 357/74 |
| 4,982,265 A | 1/1991 | Watanabe et al. | 357/75 |
| 4,996,587 A | 2/1991 | Hinrichsmeyer et al. | 357/74 |
| 5,012,323 A | 4/1991 | Farnworth | 357/75 |
| 5,025,306 A | 6/1991 | Johnson et al. | 357/75 |
| 5,040,052 A | 8/1991 | McDavid | 357/80 |
| 5,138,438 A | 8/1992 | Masayuki et al. | 357/75 |
| 5,140,404 A | 8/1992 | Fogal et al. | 357/70 |
| 5,165,067 A | 11/1992 | Wakefield et al. | 257/783 |

(List continued on next page.)

FOREIGN PATENT DOCUMENTS

| | | | |
|---|---|---|---|
| EP | 503 201 A2 | 12/1991 | ......... H01L/23/495 |
| JP | 54-128274 | 4/1979 | ........... H01L/23/30 |

(List continued on next page.)

*Primary Examiner*—Ernest Karlsen
*Assistant Examiner*—Scott B. Geyer
(74) *Attorney, Agent, or Firm*—Bever, Hoffman & Harms, LLP; James E. Parsons

(57) ABSTRACT

A semiconductor package including plural semiconductor chips, and a wire bonding step for electrically interconnecting the semiconductor chips, are disclosed. In an exemplary method, a substrate is provided. Conductive circuit patterns are provided outside of a chip mounting region of the substrate, and conductive transfer patterns are provided proximate to the chip mounting region. Chips are placed in the chip mounting region. Conductive wires are bonded between input/output pads of a first chip and respective transfer patterns, and other conductive wires are bonded between input/output pads of a second chip and the same transfer patterns, thereby electrically connecting respective input/output pads of the two chips through a pair of bond wires and an intermediate transfer pattern.

12 Claims, 7 Drawing Sheets

U.S. PATENT DOCUMENTS

| | | | |
|---|---|---|---|
| 5,198,888 A | 3/1993 | Sugano et al. | 257/686 |
| 5,229,647 A | 7/1993 | Gnadinger | 257/785 |
| 5,291,061 A | 3/1994 | Ball | 257/686 |
| 5,323,060 A | 6/1994 | Fogal et al. | 257/777 |
| 5,334,875 A | 8/1994 | Sugano et al. | 257/686 |
| 5,347,429 A | 9/1994 | Kohno et al. | 361/813 |
| 5,422,435 A | 6/1995 | Takiar et al. | 174/52.4 |
| 5,426,563 A | 6/1995 | Moresco et al. | 361/689 |
| 5,432,729 A | 7/1995 | Carson et al. | 365/63 |
| 5,462,624 A | 10/1995 | Kwon | 156/257 |
| 5,463,253 A | 10/1995 | Waki et al. | 257/724 |
| 5,473,196 A | 12/1995 | De Givry | 257/786 |
| 5,495,394 A | 2/1996 | Kornfeld et al. | 361/764 |
| 5,495,398 A | 2/1996 | Takiar et al. | 361/790 |
| 5,502,289 A | 3/1996 | Takiar et al. | 174/266 |
| 5,514,907 A | 5/1996 | Moshayedi | 257/723 |
| 5,569,625 A | 10/1996 | Yoneda et al. | 29/827 |
| 5,581,498 A | 12/1996 | Ludwig et al. | 365/63 |
| 5,587,341 A | 12/1996 | Masayuki et al. | 437/206 |
| 5,614,766 A | 3/1997 | Takasu et al. | 257/777 |
| 5,637,536 A | 6/1997 | Val | 438/106 |
| 5,637,912 A | 6/1997 | Cockerill et al. | 257/620 |
| 5,682,062 A | 10/1997 | Gaul | 257/686 |
| 5,689,135 A | 11/1997 | Ball | 257/676 |
| 5,696,031 A | 12/1997 | Wark | 437/209 |
| 5,715,147 A | 2/1998 | Nagano | 361/813 |
| 5,721,452 A | 2/1998 | Fogal et al. | 257/685 |
| 5,739,581 A | 4/1998 | Chillara et al. | 257/668 |
| 5,783,870 A | 7/1998 | Mostafazadeh et al. | 257/791 |
| 5,793,108 A | 8/1998 | Nakahishi et al. | 257/723 |
| 5,798,014 A | 8/1998 | Weber | 156/263 |
| 5,815,372 A | 9/1998 | Gallas | 361/760 |
| 5,861,666 A | 1/1999 | Bellaar | 257/686 |
| 5,872,025 A | 2/1999 | Cronin et al. | 438/109 |
| 5,885,849 A | 3/1999 | DiStefano et al. | 438/108 |
| 5,886,412 A | 3/1999 | Fogal et al. | 257/777 |
| 5,917,242 A | 6/1999 | Ball | 257/737 |
| 5,952,611 A | 9/1999 | Eng et al. | 174/52.4 |
| 5,973,403 A | 10/1999 | Wark | 257/777 |
| 6,005,778 A | 12/1999 | Spielberger et al. | 361/770 |
| RE36,613 E | 3/2000 | Ball | 257/777 |
| 6,051,886 A | 4/2000 | Fogal et al. | 257/777 |
| 6,057,598 A | 5/2000 | Payne et al. | 257/723 |
| 6,072,243 A | 6/2000 | Nakanishi | 257/783 |
| 6,080,264 A | 6/2000 | Ball | 156/292 |
| 6,133,637 A | 10/2000 | Hikita et al. | 257/777 |
| 6,184,463 B1 | 2/2001 | Panchou et al. | 174/52.4 |
| 6,214,641 B1 | 4/2001 | Akram | 438/107 |
| 6,232,561 B1 * | 5/2001 | Schmidt et al. | 174/260 |
| 6,235,554 B1 | 5/2001 | Akram et al. | 438/109 |
| 6,316,838 B1 * | 11/2001 | Ozawa et al. | 257/778 |
| 6,340,842 B1 * | 1/2002 | Nakamura | 257/724 |

FOREIGN PATENT DOCUMENTS

| | | | | |
|---|---|---|---|---|
| JP | 56062351 | 5/1981 | | H01L/25/04 |
| JP | 60182731 | 9/1985 | | H01L/21/60 |
| JP | 61059862 | 3/1986 | | H01L/25/04 |
| JP | 61117858 | 6/1986 | | H01L/25/08 |
| JP | 62119952 | 6/1987 | | H01L/25/04 |
| JP | 62126661 | 6/1987 | | H01L/25/04 |
| JP | 62-126661 | 6/1987 | | H01L/25/04 |
| JP | 62142341 | 6/1987 | | H01L/25/04 |
| JP | 63128736 | 6/1988 | | H01L/23/04 |
| JP | 63211663 | 9/1988 | | H01L/25/08 |
| JP | 63-244654 | 10/1988 | | H01L/23/28 |
| JP | 63244654 | 10/1988 | | H01L/23/28 |
| JP | 1028856 | 1/1989 | | H01L/27/00 |
| JP | 64001269 | 1/1989 | | H01L/25/04 |
| JP | 1071162 A | 3/1989 | | H01L/23/52 |
| JP | 1099248 A | 4/1989 | | H01L/25/08 |
| JP | 3169062 | 7/1991 | | H01L/25/065 |
| JP | 4028260 | 1/1992 | | H01L/25/065 |
| JP | 4-56262 | 2/1992 | | H01L/25/65 |
| JP | 4056262 | 2/1992 | | H01L/25/065 |
| JP | 4096358 | 3/1992 | | H01L/25/065 |
| JP | 4116859 | 4/1992 | | H01L/25/065 |
| JP | 4-368154 A | 12/1992 | | H01L/23/00 |
| JP | 4-368167 | 12/1992 | | H01L/25/065 |
| JP | 5013665 | 1/1993 | | H01L/25/065 |
| JP | 5-75015 | 3/1993 | | H01L/25/065 |
| JP | 5109975 | 4/1993 | | H01L/25/065 |
| JP | 5136323 | 6/1993 | | H01L/23/50 |
| JP | 5-283601 | 10/1993 | | H01L/23/52 |
| JP | 10-256470 | 9/1998 | | H01L/25/065 |
| JP | 11-310150 | * 10/1999 | | H01L/25/065 |

* cited by examiner

WIRE BONDING METHOD AND SEMICONDUCTOR PACKAGE MANUFACTURED USING THE SAME

BACKGROUND OF THE INVENTION

1. Field of the Invention

The present invention relates to a wire bonding method and a semiconductor package manufactured using the method, and, more particularly, the present invention relates to a wire bonding method and semiconductor package including a plurality of electrically interconnected semiconductor chips.

2. Description of the Related Art

Conventionally, a semiconductor package may include a plurality of semiconductor chips that are stacked or arranged side by side on a printed circuit board, a lead frame or a circuit film. (The descriptions below will be given mainly with reference to a printed circuit board.) Such semiconductor packages are known as stack-type semiconductor packages or multi-chip module (MCM) packages, respectively.

Often in such packages, one or more of the semiconductor chips are electrically connected to metal circuit patterns of the printed circuit board through conductive wires, which are sometimes called bond wires. The semiconductor chips are also electrically connected to one another through conductive wires bonded between their respective input and output pads.

A stack-type semiconductor package 100' is illustrated in FIG. 1a, and a state of the stack type semiconductor package before encapsulation is illustrated in FIG. 1b.

As shown in FIGS. 1a and 1b, a first semiconductor chip 2 is provided. A plurality of rows (for example, two staggered rows) of first input and output pads 2a are formed on an upper surface of the first semiconductor chip 2. A second semiconductor chip 4 is stacked on and affixed to the upper surface of the first semiconductor chip 2 by an adhesive means 6. Semiconductor chip 4 is located within input and output pads 2a of semiconductor chip 2. One row of second input and output pads 4a is formed on an upper surface of the second semiconductor chip 4.

A printed circuit board 20 is affixed to a lower surface of the first semiconductor chip 2 by another adhesive means 6.

As well known in the art, the printed circuit board 20 includes a resin layer 22. Electrically conductive circuit patterns are formed on the upper and lower surfaces of the resin layer 22. In particular, first circuit patterns 24, which include bond fingers 24a, are formed on the upper surface of the resin layer 22 outside the perimeter of first semiconductor chip 2. Second circuit patterns 24, which include ball lands 24b, are formed on the lower surface of the resin layer 22. The first and second circuit patterns 24 are electrically connected with each other through via-holes 25 through resin layer 22. On the upper surface of the resin layer 22, the first circuit patterns 24, excluding the bond fingers 24a, are coated with cover coats 26 or the like. Likewise, on the lower surface of the resin layer 22, the second circuit patterns 24, excluding the ball lands 24b, are coated with cover coat 26 or the like.

Some of the first input and output pads 2a of the first semiconductor chip 2 are electrically connected to second input and output pads 4a of the second semiconductor chip 4 through first conductive wires 8a that extend between them. Other first input and output pads 2a of the first semiconductor chip 2 are electrically connected to the bond fingers 24a of the printed circuit board 20 through second conductive wires 8b. Particular wires 8a, 8b may carry a ground voltage, power supply voltage, or data/instruction signals.

A hardened encapsulating section 30 of a predetermined shape covers the first semiconductor chip 2, the second semiconductor chip 4, the first and second conductive wires 8a and 8b, and the inner portion of the upper surface of circuit board 20, thereby protecting those components from the external environment.

Conductive balls 40 are fused to the ball lands 24b on the lower surface of the printed circuit board 20, and function as input and output terminals for communication with semiconductor chips 2, 4.

Hereinafter, a method for electrically connecting the first and second semiconductor chips 2 and 4 with each other through the conductive wires 8a and for electrically connecting first semiconductor chip 2 and the bond fingers 24a of the printed circuit board 20 through conductive wires 8b will be described with reference to FIGS. 2a through 2d.

First, conductive balls 8d each having a predetermined size are formed with a wire bonder on some of the first input and output pads 2a of first semiconductor chip. 2. After the balls 8d are formed, the conductive wires drawn from balls 8d are cut off (see FIG. 2a). The drawing reference numeral 50 represents a capillary portion of a wire bonder for implementing a wire boding operation.

Then, to electrically connect the two semiconductor chips 2 and 4, one end of each of a plurality of conductive wires 8a are bonded to selected ones of the second input and output pads 4a of the second semiconductor chip 4, and the opposite end of those conductive wires 8a are each connected to one of the conductive balls 8d that were previously formed on some of the first input and output pads 2a of the first semiconductor chip 2 (see FIGS. 2b and 2c). To accomplish this wire bond between semiconductor chips 2 and 4, balls are formed by capillary 50 using the conductive wire material, and the balls are fused to the selected second input and output pads 4a of the second semiconductor chip 4. Capillary 50 then forcibly squeezes and fuses the opposite portion of each conductive wire against a ball 8d. Next, capillary 50 cuts the conductive wire.

Subsequently, wire bonds 8b are connected between other first input and output pads 2a of the first semiconductor chip 2 and bond fingers 24a of printed circuit board 20.

However, this conventional wire bonding method, and the resulting semiconductor packages, suffer from defects due to the fact that conductive balls 8d are formed in advance on some of the input and output pads of the first semiconductor chip 2, afterwhich an end of a wire 8a is bonded to each of the balls 8d. This can lead to an inferior wire bond connection, and reduced bonding yield.

Moreover, since the wire bonding operation is implemented in a manner that brings capillary 50 into contact with the conductive balls 8d, the lifetime of capillary 50 can be shortened, and the tip of capillary 50 can be seriously contaminated with the material of balls 8d.

Furthermore, because a separate process for forming the conductive balls 8d is required, wire bonding time is lengthened and the manufacturing cost of the entire semiconductor package is increased.

On the other hand, if the first and second semiconductor chips were directly wire bonded with each other without conductive balls 8d, the input and output pads of the first semiconductor chip 2 can be broken by vibration energy of capillary 50, or first semiconductor chip 2 itself can be cracked by capillary 50. In view of this grave possible outcome, the wire bonding method using conductive balls 8d has been adopted.

SUMMARY OF THE INVENTION

One object of the present invention is to provide a wire bonding method for a semiconductor package containing a plurality of semiconductor chips. The semiconductor chips may be stacked one on top the other or arranged side by side on the same horizontal plane. The plural semiconductor chips are electrically interconnected using the disclosed methods without suffering from the problems associated with the conventional wire bonding methods described above.

Another object of the present invention is to provide a wire bonding method which can lengthen the lifetime of a capillary of a wire bonder and reduce manufacturing costs.

Another object of the present invention is to provide a reliable semiconductor package that includes a plurality of electrically interconnected semiconductor chips (either stacked or side by side) and can be manufactured effectively and efficiently.

In order to achieve the above objects and others, an exemplary embodiment of the present invention includes a wire bonding method comprising the steps of: providing a planar circuit board having a resin layer and possessing a chip mounting region at a center portion of the resin layer, the circuit board being formed with a plurality of circuit patterns outside the chip mounting region and one or more transfer patterns between the chip mounting region and the circuit patterns; affixing plural semiconductor chips to the circuit board in the chip mounting region, either in a stack or arranged side by side in the same horizontal plane; electrically connecting input and output pads of one semiconductor chip among the semiconductor chips to one or more of the transfer patterns of the circuit board through conductive wires bonded between them; and electrically connecting input and output pads of another semiconductor chip to the same respective transfer patterns of the circuit board through conductive wires bonded between them, thereby electrically connecting the semiconductor chips with one another through one or more pairs of bond wires and a transfer pattern bonded between the bond wires of each pair.

The circuit board so provided can be implemented such that at least one transfer pattern is formed between the chip mounting region and the circuit patterns radiating from the chip mounting region.

The transfer patterns can be short, planar, rectangular, electrically-isolated pads having a lengthwise orientation that is perpendicular to, or substantially perpendicular to, a lengthwise direction of the adjacent circuit patterns. The transfer patterns may be formed of copper, Alloy 42 or some other metal, and may be plated with silver (Ag) or gold (Au).

Alternatively, a predetermined number of circuit patterns among the plurality of circuit patterns can be used as the transfer patterns.

An exemplary embodiment of a semiconductor package within the present invention comprises: at least one first semiconductor chip having input and output pads; at least one second semiconductor chip having input and output pads, the second semiconductor chip being stacked on or positioned laterally adjacent to the first semiconductor chip; a circuit board affixed by an adhesive means to a lower surface of the first semiconductor chip or to lower surfaces of adjacent first and second semiconductor chips, the circuit board having a resin layer and including a plurality of electrically-conductive circuit patterns and one or more transfer patterns, the circuit board possessing ball lands formed on an upper surface or a lower surface of the resin layer in such a way as to be connected with the circuit patterns; a plurality of conductive wires, with each wire being electrically connected between one of the input and output pads of the first or second semiconductor chips and the transfer patterns, or between one of the input and output pads of the first and second semiconductor chips and the circuit patterns; a hardened encapsulating material that covers the first semiconductor chip, the second semiconductor chip, the conductive wires, and at least one surface of the circuit board, wherein said encapsulating material protects those components from the external environment; and conductive balls fused to the ball lands of the circuit board.

In such an embodiment, at least one transfer pattern can be formed between the first and second semiconductor chips and/or adjacent circuit patterns. Moreover, the transfer pattern(s) can have a lengthwise direction that is perpendicular to, or substantially perpendicular to, a lengthwise direction of the circuit patterns. The transfer patterns can be metal (e.g., Cu) plated with silver (Ag) or gold (Au).

Alternatively, the transfer patterns can comprise a predetermined number of circuit patterns among the plurality of circuit patterns.

The exemplary wire bonding method and semiconductor package enjoy numerous advantages compared to the conventional method and package described above. For example, by virtue of the transfer patterns, the input and output pads of the first and second semiconductor chips may be electrically connected with one another with an increased bonding yield. In addition, since the tip of the capillary of the wire bonder is not pressed onto a pre-formed ball 8d, contamination of the capillary with foreign material is avoided and the lifetime of the capillary can be lengthened. Furthermore, because it is not necessary to pre-form balls on the input and output pads of the first semiconductor chip, the manufacturing procedure is simplified and manufacturing costs are reduced.

BRIEF DESCRIPTION OF THE DRAWINGS

The above objects and other features and advantages of the present invention will become more apparent after a reading of the following detailed description, when taken in conjunction with the drawings, in which.

DETAILED DESCRIPTION OF EXEMPLARY EMBODIMENTS

Figure 1A:
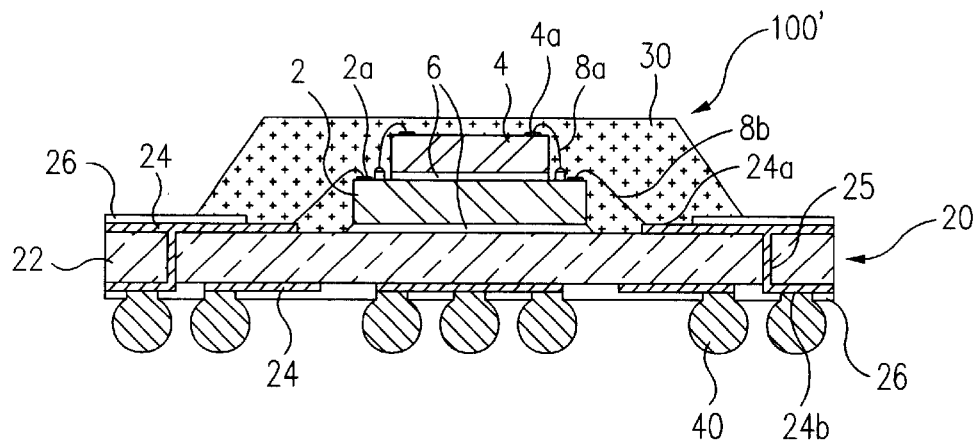
FIG. 1a is a cross-sectional side view of a conventional semiconductor package housing a stack of two electrically-interconnected semiconductor chips.
Figure 1B:
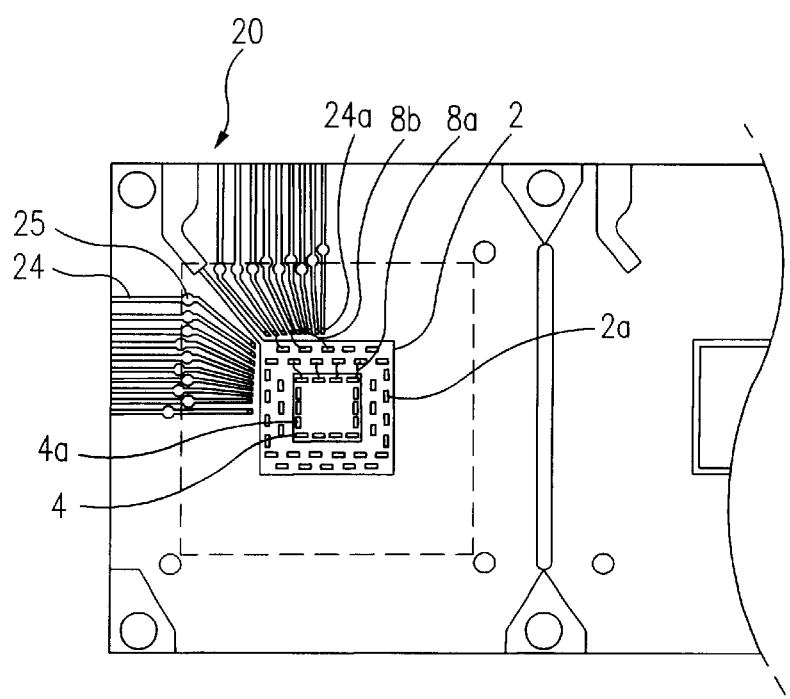
FIG. 1b is a top plan view of the conventional semiconductor package of FIG. 1a before the application of an encapsulating material.
Figure 2A:
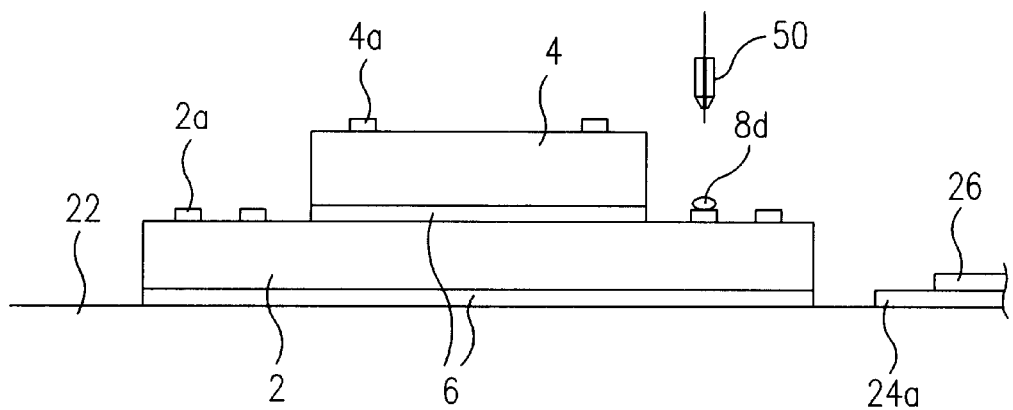
FIGS. 2a through 2d are side views of stages of a conventional method for electrically connecting two stacked semiconductor chips using conductive wires.
Figure 2B:
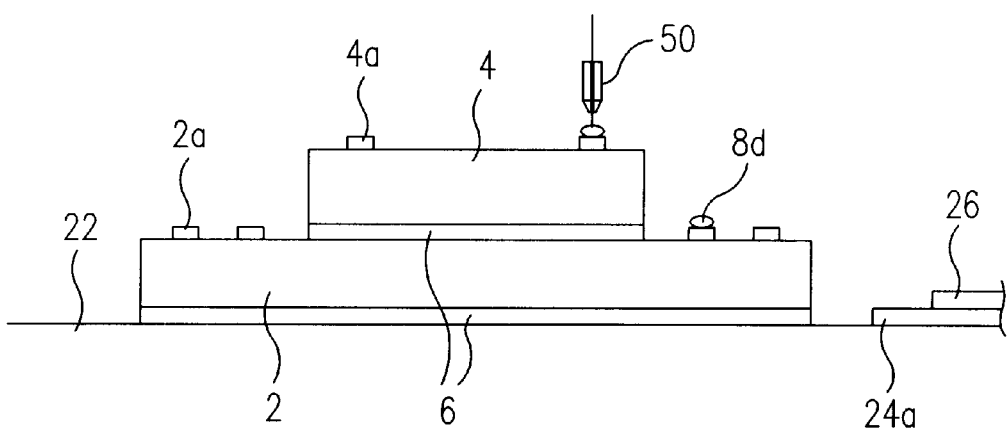
Figure 2C:
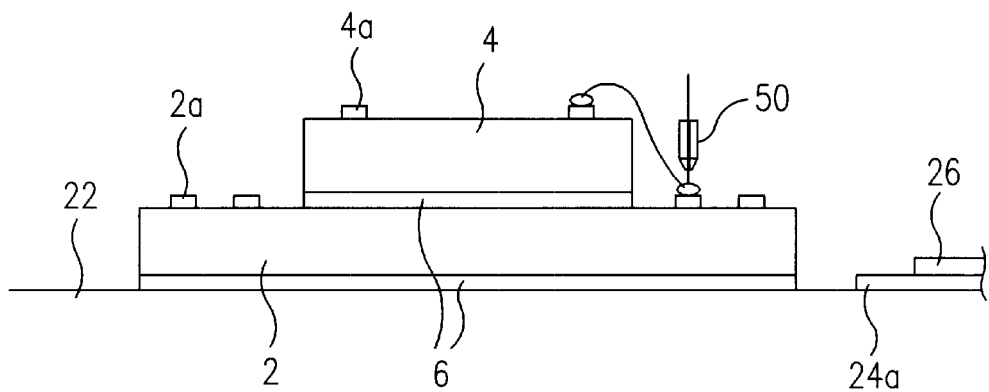
Figure 2D:
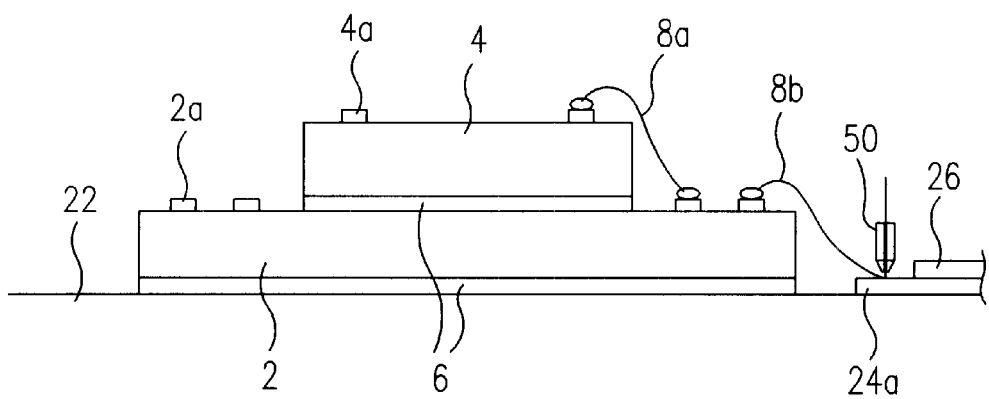

Reference will now be made in greater detail to exemplary embodiments of the invention. Wherever possible, the same reference numerals will be used throughout the drawings and the description to refer to the same or like parts.

Figure 3A:
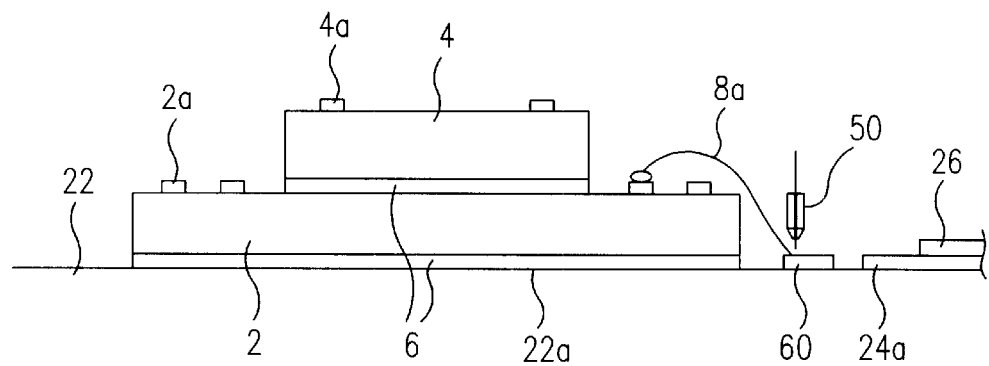
FIGS. 3a through 3c are side views of a wire bonding method in accordance with an exemplary embodiment of the present invention.
Figure 4:
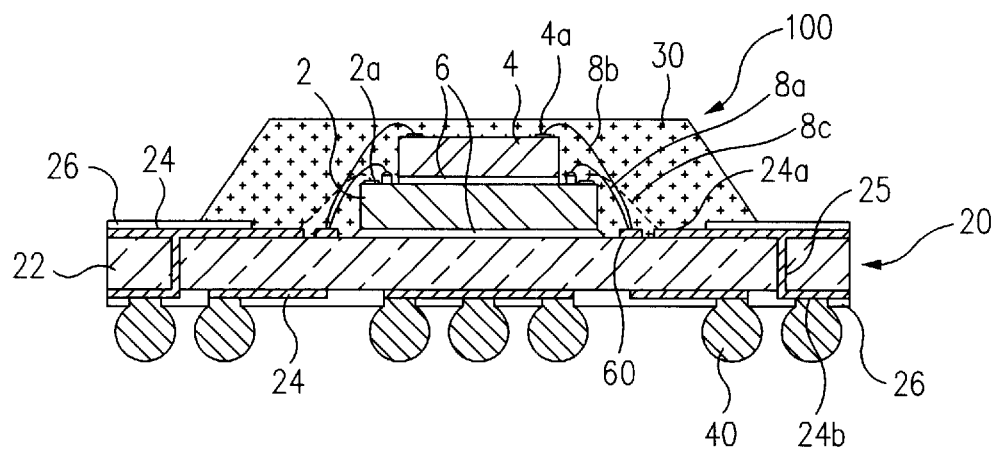
FIG. 4 is a cross-sectional side view of a semiconductor package that includes stacked semiconductor chips and is manufactured using the wire bonding method of FIGS. 3a–3d.

First, a planar circuit board 20 is provided (FIGS. 3a and 4). The circuit board 20 has a resin layer 22. A chip mounting region 22a is defined at a center portion of a planar upper surface of the resin layer 22. A plurality of circuit patterns 24, which include bond fingers 24a, are formed outside the chip mounting region 22a. Conductive transfer patterns 60 are formed on the upper surface of resin layer 22 laterally between the chip mounting region 22a and the circuit patterns 24.

A plurality of semiconductor chips are mounted on the upper surface of circuit board 20 within chip mounting region 22a.

In this embodiment, a first semiconductor chip 2 is affixed to the upper surface of resin layer 22 within chip mounting region 22a by an adhesive means 6, which may be a resin, film, or tape adhesive. A smaller second semiconductor chip is affixed using another adhesive means 6 to the upper surface of first semiconductor chip 2. Alternatively, instead of having stacked semiconductor chips 2, 4, the package may have plural semiconductors arranged adjacent to one another on the upper surface of circuit board 20, i.e., in the same horizontal plane. Such an MCM package embodiment is discussed further below. In addition, while this example employs a printed circuit board 20, a lead frame or circuit film can be used in place of circuit board 20.

Figure 3B:
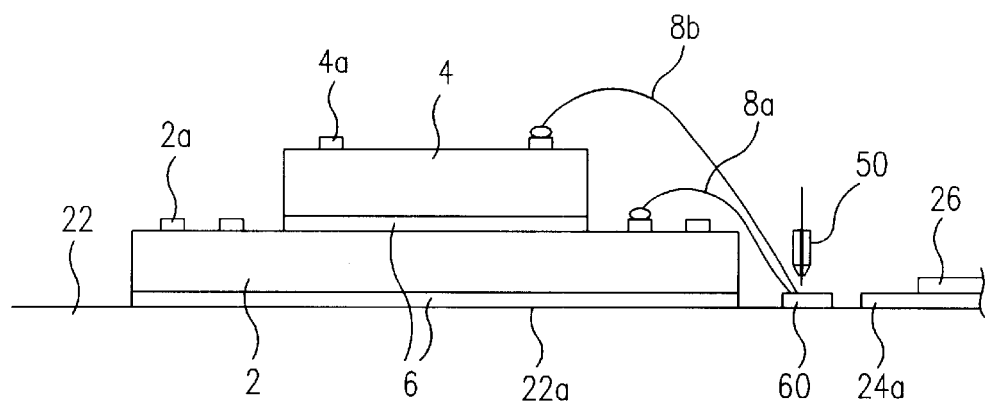
Figure 3C:
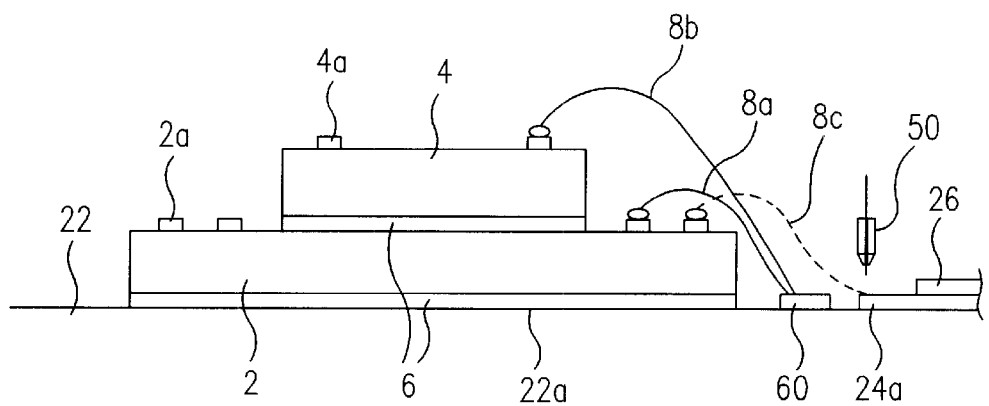
Figure 5:
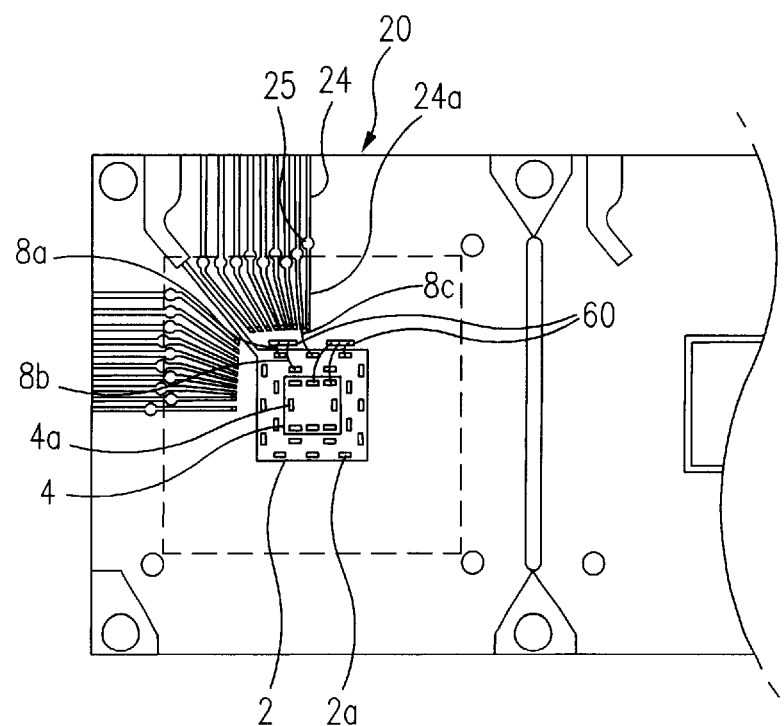
FIG. 5 is a top plan view of the semiconductor package of FIG. 4 before the application of an encapsulating material.

With reference to FIGS. 3a through 3c, second semiconductor chip 4 is stacked on first semiconductor chip 2. Second semiconductor chip 4 is smaller in area than first semiconductor chip 2 such that second semiconductor chip 4 may be placed between opposing rows of input and output pads 2a of first semiconductor chip 2. Chips 2, 4 have input and output pads 2a, 4a along all four edges of their upper surfaces (as in FIG. 5), or, alternately along only two edges (not shown). The input and output pads 2a of first semiconductor chip 2 of FIG. 5 are in two rows, and the pads 2a of the two rows are staggered. Semiconductor chips 2, 4 may both be any type of devices, such as memory devices or a combination of two different types of devices, such as a microprocessor and a memory device or a sensor chip and a microprocessor.

One or more electrically isolated rectangular pads, called transfer patterns 60 herein, are provided on the upper surface of circuit board 20 beyond the perimeters of semiconductor chips 2 and 4, as shown in FIGS. 3a–3c, 4 and 5.

Next, using a capillary 50 of a wire bonder (not shown), one end of a first conductive wire 8a is bonded to an input and output pad 2a of the first semiconductor chip 2. The other end of the first conductive wire 8a is then bonded to the transfer pattern 60 (see FIG. 3a). Subsequently, one end of a second conductive wire 8b is bonded to an input and output pad 4a of the second semiconductor chip 4. The other end of the second conductive wire 8b is then bonded to the same transfer pattern 60 (see FIG. 3b). The process is repeated for all of the input and output pads of the two semiconductor chips 2 and 4 that are to be electrically interconnected. As a result, selected input and output pads 2a of the first semiconductor chip 2 are each electrically connected through a first conductive wire 8a, transfer pattern 60, and second conductive wire 8b to a selected input and output pad 4a of second semiconductor chip 4. Hence, an electrical signal from the first semiconductor chip 2 (or the second semiconductor chip 4) may be transferred to the second semiconductor chip 4 (or the first semiconductor chip 2) via a first conductive wire 8a, a transfer pattern 60, and a second conductive wire 8b.

The transfer patterns 60 of the upper surface of circuit board 20 can have a lengthwise direction that is perpendicular or nearly perpendicular to a lengthwise direction of the adjacent circuit patterns 24 that radiate outwardly from the stack of semiconductor chips 2, 4 and chip mounting region 22a. The transfer patterns 60 can be formed of copper, Alloy 42, or some other metal and may be plated with silver (Ag) or gold (Au). Other shapes of transfer patterns 60 can be used.

Alternatively, a predetermined number of circuit patterns 24 among the plurality of circuit patterns 24 can be used as the transfer patterns 60.

In the above method, because capillary 50 does not bond the lower end portion of any bond wire to a pre-formed ball 8d (see FIGS. 2a–2d), but rather bonds the lower end portions of two separate wires 8a, 8b to a planar transfer pattern 60 on the upper surface of circuit board 20, the forceful vibration energy of capillary 50 or the like is not transmitted to the target semiconductor chip. Thus, the particular input and output pads and the chip itself are less likely to be broken or cracked relative to the method of FIGS. 2a–2d.

To complete the wire bonding method, one end of a third conductive wire 8c is bonded to selected other input and output pads 2a (or pads 4a) of the first semiconductor chip 2 (of the second semiconductor chip 4), and the other end of the third conductive wire 8c is bonded to one of the bond fingers 24a of the circuit pattern 24 (see FIG. 3c) Accordingly, semiconductor chips 2 and 4 may be electrically connected to bond fingers 24a through wires 8c, as well as being electrically connected to each other through pairs of wires 8a, 8b and an intermediary transfer pattern 60.

Of course, it can be also contemplated, without departing from the scope of the present invention, that the second semiconductor chip 4 or the first semiconductor chip 2 may first be electronically connected to the bond fingers 24a using the third conductive wires 8c, after which the input and output pads of the first semiconductor chip 2 or the second semiconductor chip 4 may be electronically connected to the transfer pattern(s) 60 using the first or second conductive wires 8a or 8b. In a further alternative embodiment, one or more other conductive wires (not shown) may be connected between a bond finger 24a and a transfer pattern 60. For example, a voltage may be applied from a circuit pattern 24 to transfer pattern 60, and from there to chips 2, 4.

FIG. 4 is a cross-sectional side view illustrating a semiconductor package 100 which may be manufactured using the wire bonding method discussed above. FIG. 5 is a plan view illustrating an intermediate state of semiconductor package 100 prior to the application an encapsulating material 30 over chips 2, 4.

Referring to FIGS. 4 and 5, semiconductor package 100 includes a first semiconductor chip 2. First semiconductor chip 2 has two rows of staggered first input and output pads 2a on an upper active surface of chip 2. Second semiconductor chip 4 is affixed to the upper surface of the first semiconductor chip 2 by adhesive means 6. Second semiconductor chip 4 has one row of second input and output pads 4a on an upper surface of semiconductor chip 4.

The upper surface of circuit board 20 is affixed to a lower surface of the first semiconductor chip 2 by adhesive means 6. As described above, the circuit board 20 includes a core resin layer 22, which may be a glass-fiber filled organic (e.g., epoxy) laminate. Circuit board 20 includes a plurality of conductive circuit patterns 24 outside perimeter of first semiconductor chip 2 (see FIG. 5). The circuit patterns 24 extend radially from chip 2 toward the perimeter of circuit board 20. The circuit patterns 24 include the bond fingers 24a. Other conductive circuit patterns 24, which include ball lands 24b, are formed on a lower surface of the resin layer 22 (see FIG. 4). The circuit patterns 24, including the bond fingers 24a and the ball lands 24b, are formed of copper (Cu), Alloy 42, or the like. The bond fingers 24a are plated with silver (Ag) or gold (Ag) so as to improve a connection with the conductive wires subsequently bonded to bond fingers 24. The ball lands 24b are plated with silver (Ag), nickel (Ni), palladium (Pd), or the like so as to enhance a fused connection to a conductive ball 40. Further, upper surface portions of the circuit patterns 24, excluding the bond fingers 24a and the ball lands 24b, are coated with insulative cover coats 26 and the like, so as to be protected from an external environment.

The circuit patterns 24 of the upper and lower surfaces of circuit board 20 are electrically connected with each other through conductive via-holes 25 extending vertically through resin layer 22. Via-holes 25 may be formed of copper plated on the inner walls of a hole through resin layer 22.

The one or more transfer patterns 60 are electrically-isolated, planar, rectangular, island-like pads formed on the upper surface of resin layer 22 at predetermined locations between the perimeter of the first semiconductor chip 2 and the bond fingers 24a. Transfer patterns 60 may be formed so as to have a lengthwise direction that is perpendicular to or substantially perpendicular to the lengthwise direction of the circuit patterns 24.

In FIG. 5, only two transfer patterns 60 are shown, but of course the number of transfer patterns can vary depending, for example, on the number of electrical connections to be made between semiconductor chips 2 and 4. For example, only one transfer pattern 60 may be formed. Alternatively, a total of eight transfer patterns 60 may be formed, two adjacent each of the four sides of semiconductor chip 2. It is not necessary that all of the transfer patterns 60 ultimately are used as bond wire connection points.

Further, the shape of transfer patterns 60 may vary. In the embodiments of FIGS. 3a–3a, 4, and 5, transfer patterns 60 are short rectangular strips that are electrically isolated from the laterally adjacent circuit patterns 24 of circuit board 20. Typically, transfer patterns 60 are formed of the same electrically conductive materials as circuit patterns 24, and are formed simultaneously with circuit patterns 24. For example, circuit patterns 24 and transfer patterns 60 may be formed by photolithographic masking and etching of a copper foil that is laminated onto the upper surface of resin layer 22. The upper surface of transfer patterns 60 may be plated with silver (Ag), gold (Au) or the like so as to ensure easy bonding thereof to the conductive wires 8a and 8b. Cover coating 26 (FIG. 4) is not applied over transfer patterns 60.

Alternatively, predetermined number of circuit patterns among the plurality of circuit patterns can be used as transfer patterns 60.

In package 100 of FIGS. 4 and 5, the input and output pads 2a of the first semiconductor chip 2 and the transfer patterns 60 are electrically connected to each other by the first conductive wires 8a. The input and output pads 4a of the second semiconductor chip 4 and the transfer patterns 60 are electrically connected to each other by the second conductive wires 8b. As shown in FIG. 5, the number of conductive wires 8a, 8b connected to each transfer pattern 60 may vary. The two transfer pads 60 illustrated in FIG. 5 have two and three bond wire connections, respectively. In addition, the input and output pads 2a or 4a of the first semiconductor chip 2 and/or the second semiconductor chip 4 are electrically connected to the bond fingers 24a by the third conductive wires 8c.

Consequently, an electrical signal (for example, a ground voltage or a power-supply voltage or a data signal) originating from the first semiconductor chip 2 may be transferred to the transfer pattern 60 via the first conductive wire 8a, and from there be transferred to the second semiconductor chip 4 via the second conductive wire 8b that is connected to that transfer pattern 60. Alternatively, an electrical signal originating from the second semiconductor chip 4 may be transferred to the transfer pattern 60 via the second conductive wire 8b, and from there be transferred to the first semiconductor chip 2 via the first conductive wire 8a that is connected to that transfer pattern 60. Otherwise, electrical signals from the first or second semiconductor chips 2 and/or 4 may be transferred to the bond fingers 24a of circuit patterns 24 via the third conductive wires 8c. The electrical signals transferred from chips 2, 4 to the bond fingers 24a and the upper circuit patterns 24 may be transferred to the lower circuit patterns 24 through the conductive via-holes 25, and vice versa.

After the wire bonding step described above, the first semiconductor chip 2, the second semiconductor chip 4, and the first, second, and third conductive wires 8a, 8b and 8c, respectfully, and the upper surface of the circuit board 20, including the transfer patterns 60, bond fingers 24a and the upper circuit patterns 24, are encapsulated with the encapsulating material 30. Encapsulating material 30 may be an epoxy molding compound, a liquid phase encapsulant, or the like.

Subsequently, the conductive balls 40, which may be solder balls, are fused to the ball lands 24b of the circuit patterns 24 on the lower surface of the circuit board 20. Balls 40 serve as interconnects so that package 100 can be mounted to a mother board.

Practitioners will appreciate that, although the semiconductor package of the exemplary embodiment includes a printed circuit board 20, the present invention is not so limited. For example, in place of printed circuit board 20, a circuit film comprising a thin insulative film layer (e.g., polyimide), circuit patterns and so forth, or a leadframe can be used.

Figure 6A:
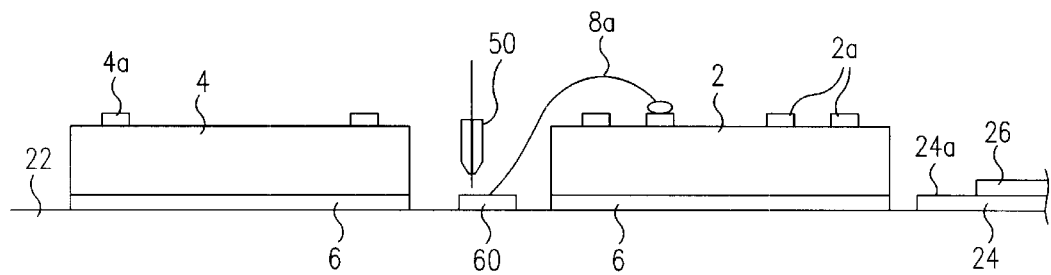
FIGS. 6a–6c are side views of an exemplary wire bonding method for a MCM package that includes a plurality of laterally adjacent semiconductor chips.
Figure 6B:
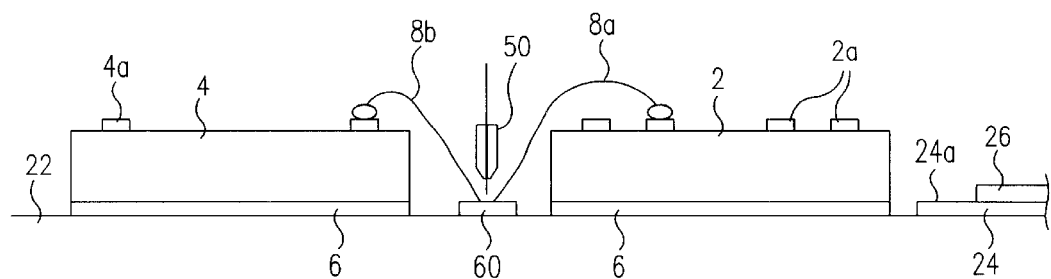
Figure 6C:
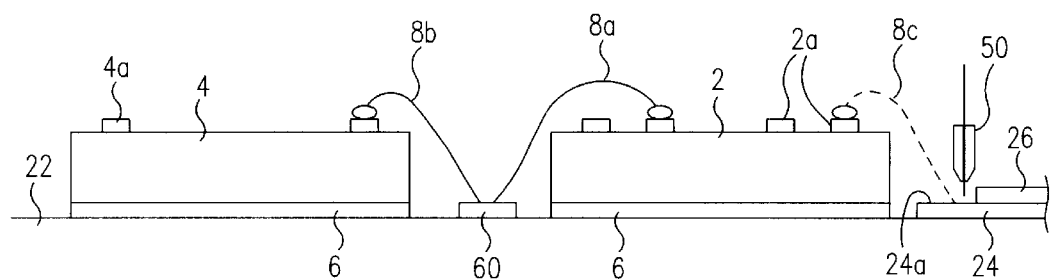
Figure 7:
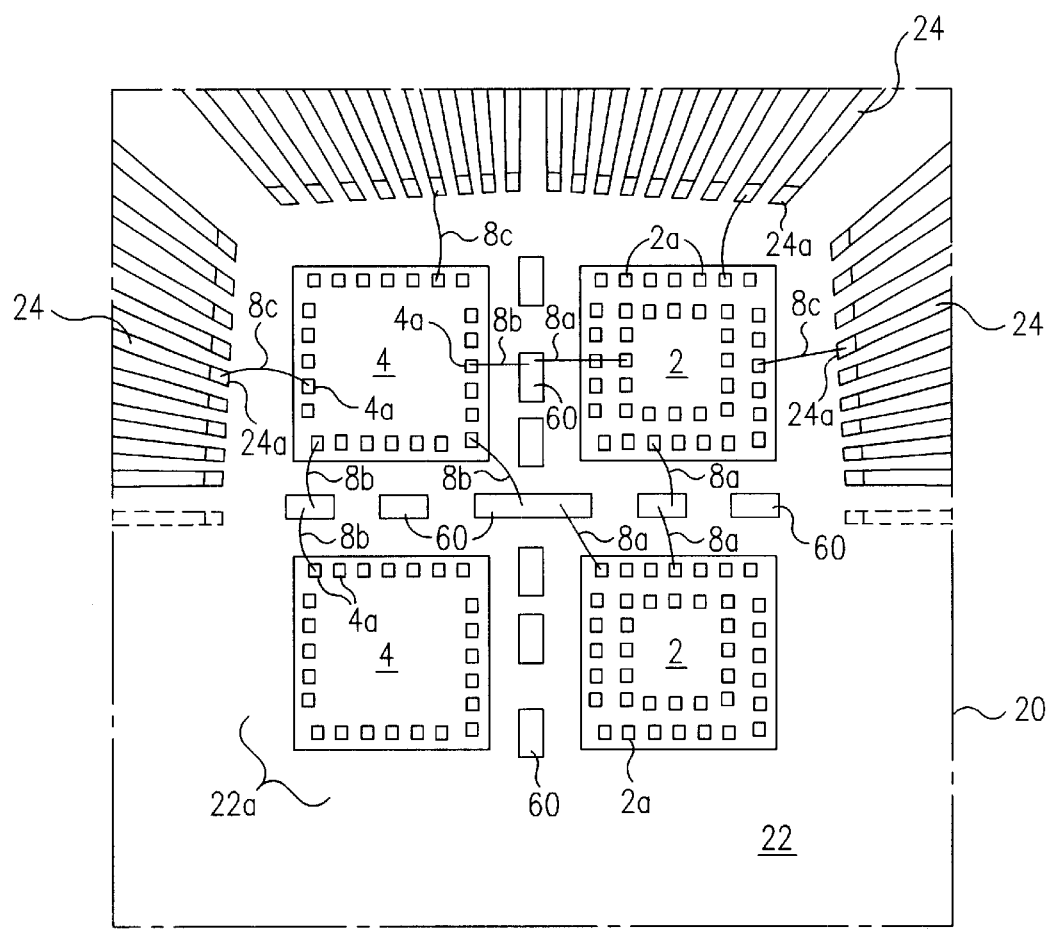
FIG. 7 is a top plan view of an MCM package that was wire bonded in accordance with the method of FIGS. 6a–6c before the application of an encapsulating material.

FIGS. 6a, 6b, 6c and 7 illustrate another exemplary embodiment of the present invention. In this embodiment, instead of having stacked semiconductor chips 2 and 4, as in FIGS. 3a–3c and 4, two first semiconductor chips 2 and two second semiconductor chips 4 are laterally adjacent to each other, thereby forming an MCM package. As shown in FIG. 7, the two first semiconductor chips 2 and the two second semiconductor chips 4 are side by side in the same horizontal plane on the upper surface of resin layer 22 of circuit board 20.

Exemplary methods of wire bonding and assembling an MCM package along the lines of FIGS. 6a, 6b, 6c and 7 are similar to the methods described above for making stacked semiconductor package 100.

Initially, a printed circuit board 20 comprising a core resin layer 22 is provided. Electrically conductive circuit patterns 24 are provided on the upper and lower surfaces of resin layer 22, and are electrically connected through resin layer 22 by via-holes 24, similar to FIG. 4. In addition, a selected number of rectangular, planar, electrically isolated, electrically conductive, island-like pads, called transfer patterns 60 herein, are formed in a cross-pattern on the upper surface of resin layer 22 between adjacent pairs of semiconductor chips 2, 4. The number, size, and shape of transfer patterns 60 may vary with the application, e.g., according to the number of semiconductor chips 2, 4 and the number of interconnections to be made between the adjacent semiconductor chips. In this instance, eleven rectangular transfer patterns 60 of varying sizes are provided on the upper surface of resin layer 22. Printed circuit board 20 could be replaced by a circuit film or a leadframe, as mentioned above.

Subsequently, a selected number of semiconductor chips 2, 4 are placed in laterally adjacent positions in a central chip mounting region 22a on the upper surface of resin layer 22 of circuit board 20, and are attached thereto by an adhesive means 6, such as a resin, an adhesive film, or a double-sided tape. In this instance, as mentioned above, two first semiconductor chips 2 and two second semiconductor chips 4 are mounted side-by-side on the upper surface of circuit board 20.

Subsequently, referring to FIG. 6a, a first conductive wire 8a is electrically connected between each of a selected number of first bonding pads 2a and one of the transfer patterns 60 by capillary 50 of a wire bonder. Next, referring to FIG. 6b, a second conductive wire 8b is electrically connected between each of a selected number of second bond pads 4a of second semiconductor chip 4 and one of the transfer patterns 60 to which a first conductive wires 8a was connected. Accordingly, since selected first bonding pads 2a of first semiconductor chip 2 are each electrically connected to s second bonding pad(s) 4a of second semiconductor chip 4 through a pair of wires 8a, 8b and an intermediate transfer pattern 60, semiconductor chips 2 and 4 are electrically interconnected. The order of connection may vary.

In addition, selected bonding pads 2a, 4a of semiconductor chips 2 and 4, respectively, may each be electrically connected to a bond finger 24a of circuit patterns 24 by connecting a third conductive wire 8c therebetween. Moreover, the two first semiconductor chips 2 may be electrically connected through a pair of first conductive wires 8a that are each electrically connected to a transfer pattern 60, and the two second semiconductor chips 4 may be electrically connected through a pair of second conductive wires 8b that are each electrically connected to a transfer pattern 60.

Subsequent assembly steps, such as the encapsulation of the semiconductor chips 2, 4 and conductive wires 8a, 8b, and 8c, are the same as those described above, and need not be addressed further.

As above, the circuit patterns 24 and transfer patterns 60 may be formed simultaneously from metal foils (e.g., Cu) laminated onto resin layer 22, and may be plated with silver, or gold, or the like.

Of course, the MCM shown in FIG. 7 as having four semiconductor chips 2, 4 is merely exemplary. For example, a different number or arrangement of semiconductor chips maybe included in the MCM, along with other components, such as surface mount resistors, capacitors, or inductors.

The wire bonding method and the semiconductor package manufactured using the method may be obtained in higher yields than is obtainable with the conventional practice described above.

Also, since the capillary of a wire bonder is not pressed into a pre-formed ball (as shown by ball 8d of FIGS. 2a–2d of the conventional practice), contamination of the capillary is avoided and the lifetime of the capillary can be lengthened.

Furthermore, because it is not necessary to form conductive balls on the input and output pads prior to implementing the wire bonding process between the chips, manufacturing procedures can be simplified and manufacturing costs can be reduced.

Practitioners will appreciate that the embodiments disclosed above are exemplary only, and that the present invention is not limited thereto, but rather includes all that is reasonably within the literal and equitable scope of the claims that follow.

What is claimed is:

1. A semiconductor package comprising:
   a substrate having a chip mounting region, a plurality of electrically conductive circuit patterns proximate to said chip mounting region, and one or more electrically conductive transfer patterns;
   at least first and second semiconductor chips in the chip mounting region, each semiconductor chip including a plurality of input/output pads, wherein the first and second semiconductor chips are stacked;
   a plurality of conductive wires, wherein at least some input/output pads of the first semiconductor chip are electrically connected to one or more of the input/output pads of the second semiconductor chip through a pair of said wires and a transfer pattern, and other input/output pads of at least one of the first and second semiconductor chips are electrically connected to the circuit patterns through other said wires.

2. The package of claim 1, wherein at least one transfer pattern is laterally between the chip mounting region and some of the circuit patterns.

3. The package of claim 1, wherein at least one transfer pattern is oriented lengthwise in a direction perpendicular to or nearly perpendicular to a lengthwise direction of adjacent circuit patterns.

4. The package of claim 1, wherein the substrate is selected from the group of a printed circuit board, a leadframe, and a circuit film.

5. The package of claim 1, wherein the one or more transfer patterns are each a planar, rectangular metal pad.

6. A semiconductor package comprising:
   substrate comprising a resin layer, with a chip mounting region, a plurality of electrically conductive circuit patterns, and one or more electrically conductive transfer patterns overlying the resin layer, said one or more transfer patterns located between the chip mounting region and at least some of the circuit patterns;
   a first semiconductor chip within the chip mounting region and electrically coupled to some of the circuit patterns; and
   a second semiconductor chip stacked on the first semiconductor chip and electrically coupled to the first semiconductor chip through at least a pair of wires and at least one said transfer pattern, with each wire having an end coupled to the transfer pattern.

7. The semiconductor package of claim 6, further comprising an encapsulant covering the substrate, the first and second semiconductor chips, the pair of wires, and the one or more transfer patterns.

8. The semiconductor package of claim 6, wherein the first semiconductor chip includes an active surface with a plurality of bond pads thereon, and the second semiconductor chip is entirely within the bond pads.

9. The semiconductor package of claim 6, wherein the second semiconductor chip is electrically coupled to at least one said circuit pattern through an electrically conductive wire.

10. A semiconductor package comprising:

a substrate comprising a resin layer, with a chip mounting region, a plurality of electrically conductive circuit patterns, and one or more electrically conductive transfer patterns overlying the resin layer;

a first semiconductor chip and a second semiconductor chip coupled to the substrate within the chip mounting region, wherein the first and second semiconductor chips are laterally adjacent to each other, are each electrically coupled to the circuit patterns through respective electrically conductive wires, and wherein the first and a second semiconductor chips are electrically coupled to each other through at least one said transfer pattern located laterally between the first and second semiconductor chips.

11. The semiconductor package of claim 10, wherein a pair of electrically conductive wires are coupled to the at least one said transfer pattern, said wires respectively electrically coupling the first and second semiconductor chips to the at least one said transfer pattern.

12. The semiconductor package of claim 6, further comprising an encapsulant covering the substrate, the first and second semiconductor chips, and the one or more transfer patterns.

* * * * *